(12) United States Patent
Yeung et al.

(10) Patent No.: US 9,721,624 B2
(45) Date of Patent: Aug. 1, 2017

(54) MEMORY WITH MULTIPLE WRITE PORTS

(71) Applicant: ARM Limited, Cambridge (GB)

(72) Inventors: Gus Yeung, Austin, TX (US);
Fakhruddin Ali Bohra, Bangalore (IN); Mudit Bhargava, Austin, TX (US); Andy Wangkun Chen, Austin, TX (US); Yew Keong Chong, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/581,229

(22) Filed: Dec. 23, 2014

(65) Prior Publication Data
US 2016/0180896 A1    Jun. 23, 2016

(51) Int. Cl.
| | | |
|---|---|---|
| *G11C 7/10* | (2006.01) | |
| *G11C 7/12* | (2006.01) | |
| *G11C 7/22* | (2006.01) | |

(52) U.S. Cl.
CPC .............. *G11C 7/1012* (2013.01); *G11C 7/12* (2013.01); *G11C 7/22* (2013.01)

(58) Field of Classification Search
CPC ............ G11C 7/1012; G11C 7/12; G11C 7/22
USPC ...... 365/189.02, 189.03, 189.05, 189.14, 78, 365/203, 206, 210.13
See application file for complete search history.

(56) References Cited

U.S. PATENT DOCUMENTS

| | | | | |
|---|---|---|---|---|
| 5,042,007 A | * | 8/1991 | D'Luna .................. | G06F 7/785 365/189.02 |
| 5,241,497 A | * | 8/1993 | Komarek ............... | G11C 7/062 257/E27.103 |
| 5,481,495 A | * | 1/1996 | Henkels .................. | G11C 8/16 365/189.02 |
| 5,544,095 A | * | 8/1996 | Longway ............... | G11C 7/062 257/390 |
| 5,629,901 A | * | 5/1997 | Ho .......................... | G11C 8/16 365/189.05 |
| 5,701,095 A | * | 12/1997 | Ohsawa ............... | H03K 17/693 326/121 |
| 6,032,241 A | * | 2/2000 | Green ................ | G06F 12/1054 365/189.03 |
| 6,055,616 A | * | 4/2000 | Panwar .................. | G06F 5/065 710/52 |

(Continued)

OTHER PUBLICATIONS

Park et al., "Column-Selection-Enabled 8T SRAM Array with ~1R/1W Multi-Port Operations for DVFS-Enabled Processors", 2011 IEEE, 6 pages.

(Continued)

*Primary Examiner* — Vu Le
*Assistant Examiner* — Sung Cho
(74) *Attorney, Agent, or Firm* — Pramudji Law Group PLLC; Ari Pramudji

(57) ABSTRACT

A memory 2 includes a regular array of storage elements 4. A regular array of write multiplexers 8 is provided outside of the regular array of storage elements 4. The storage element pitch is matched to the write multiplexer pitch. The write multiplexers 10 support a plurality of write ports. When forming a memory design 2, a given instance of an array of write multiplexers 8 may be selected in dependence upon the desired number of write ports to support and this combined with a common form of storage element array 4.

19 Claims, 3 Drawing Sheets

(56) References Cited

U.S. PATENT DOCUMENTS

Figure 1:
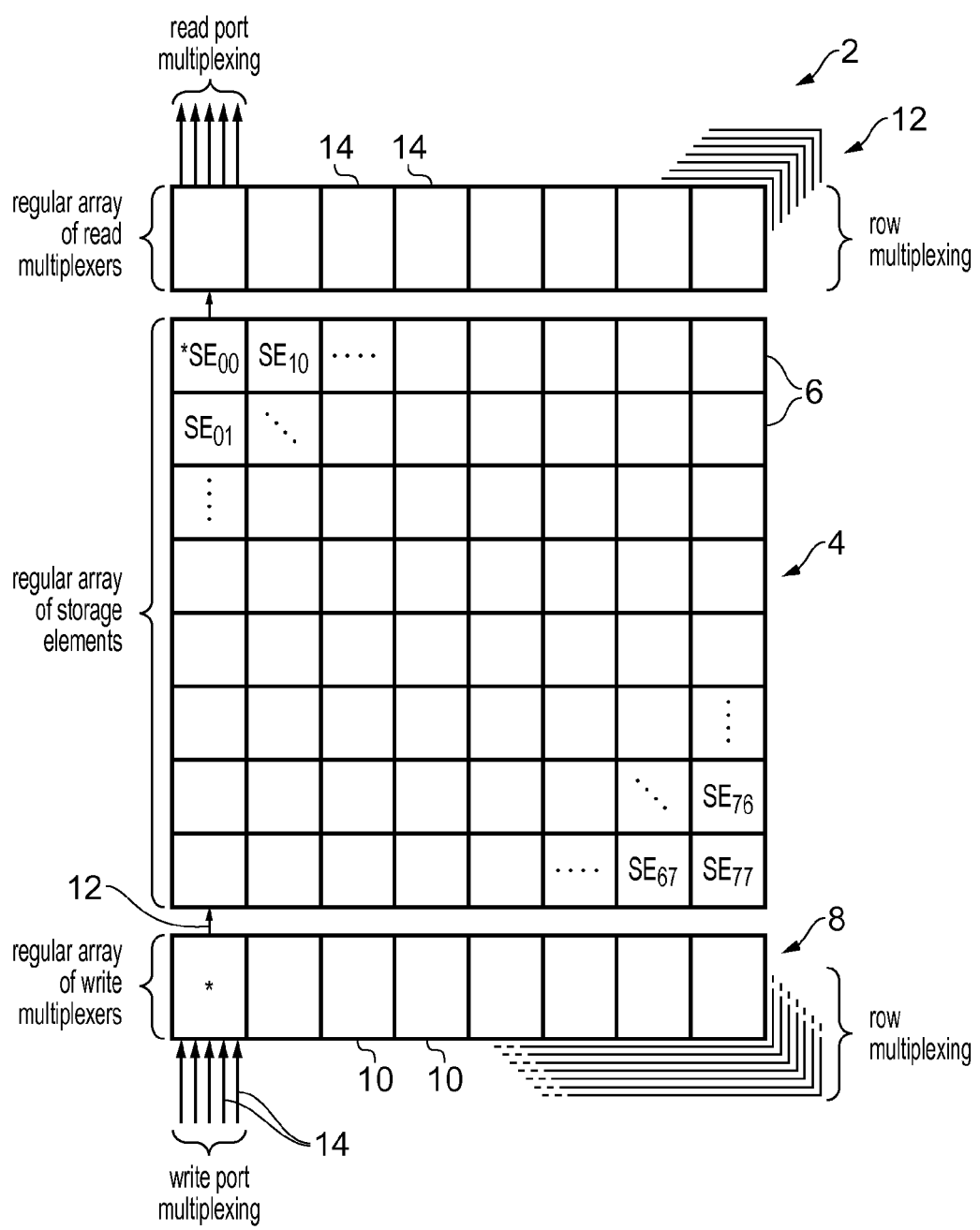

| | | | | |
|---|---|---|---|---|
| 6,122,218 | A * | 9/2000 | Kang | G11C 8/16 365/189.02 |
| 6,202,139 | B1 * | 3/2001 | Witt | G06F 9/3824 365/189.05 |
| 6,219,756 | B1 * | 4/2001 | Kasamizugami | G06F 9/30141 365/189.02 |
| 6,282,627 | B1 * | 8/2001 | Wong | G06F 9/3879 712/13 |
| 6,351,427 | B1 * | 2/2002 | Brown | G11C 7/1006 365/189.05 |
| 7,307,912 | B1 * | 12/2007 | Vernenker | G11C 7/1006 365/154 |
| 7,562,273 | B2 * | 7/2009 | Chu | G11C 29/32 714/726 |
| 8,873,329 | B1 * | 10/2014 | Zheng | G11C 8/08 365/230.01 |
| 9,070,477 | B1 * | 6/2015 | Clark | G11C 11/419 |
| 9,165,619 | B2 * | 10/2015 | Song | G11C 7/12 |
| 9,190,127 | B2 * | 11/2015 | Jang | G11C 7/22 |
| 2003/0198094 | A1 * | 10/2003 | Walker | G11C 8/16 365/200 |
| 2004/0123037 | A1 * | 6/2004 | Gomes | G06F 9/30141 711/131 |
| 2004/0268032 | A1 * | 12/2004 | Kommandur | G11C 15/00 711/108 |
| 2005/0007813 | A1 * | 1/2005 | Adams | G11C 11/419 365/154 |
| 2005/0114603 | A1 * | 5/2005 | Buti | G06F 9/3814 711/129 |
| 2006/0007754 | A1 * | 1/2006 | Vernenker | G11C 7/1039 365/189.05 |
| 2006/0114020 | A1 * | 6/2006 | Taheri | G11C 14/00 326/37 |
| 2006/0171211 | A1 * | 8/2006 | Shin | G11C 7/10 365/189.02 |
| 2008/0168231 | A1 * | 7/2008 | Ramaraju | G06F 12/0895 711/131 |
| 2009/0116324 | A1 * | 5/2009 | Christensen | G11C 7/12 365/203 |
| 2011/0241744 | A1 * | 10/2011 | Moudgill | G06F 9/30116 327/202 |
| 2011/0292748 | A1 * | 12/2011 | Adams | G06F 17/5045 365/203 |
| 2011/0317478 | A1 * | 12/2011 | Chan | G11C 29/48 365/156 |
| 2012/0195107 | A1 * | 8/2012 | Christensen | G11C 7/12 365/154 |
| 2012/0317374 | A1 * | 12/2012 | Chen | G11C 11/413 711/154 |
| 2013/0194882 | A1 * | 8/2013 | Ishii | G11C 7/222 365/194 |
| 2013/0322159 | A1 * | 12/2013 | Pelley | G11C 11/413 365/154 |
| 2014/0136778 | A1 * | 5/2014 | Khailany | G11C 7/18 711/114 |
| 2014/0211537 | A1 * | 7/2014 | Yu | G11C 11/16 365/148 |

OTHER PUBLICATIONS

Singh et al., "A 2-Port 6T SRAM Bitcell Design with Multi-Port Capabilities at Reduced Area Overhead", 11th Int'l Symposium on Quality Electronic Design, 11th Int'l Symposium on Quality Electronic Design, 2010 Crown, 8 pages.

Uhlig et al., "A Low-Power Cell-Based-Design Multi-Port Register File in 65nm CMOS Technology", 2010 IEEE, 4 pages.

Yang et al., "A Micro-Watt Multi-Port Register File with Wide Operating Voltage Range" 2009 IEEE International Workshop on Memory Technology, Design and Testing, 4 pages.

* cited by examiner

MEMORY WITH MULTIPLE WRITE PORTS

BACKGROUND

Field

This disclosure relates to the field of data processing systems. More particularly, this disclosure relates to memories having multiple write ports.

Prior Art

It is known to provide memories having multiple write ports. Such memories are provided by an array of combined storage elements and multiplexers. As the number of write ports is varied, then the elements within the array need to be redesigned in order to support the new number of write ports. There are difficulties arising from the fan in to each storage element causing impacting the reliable operation of the memory.

SUMMARY

Viewed from one aspect the present disclosure provides a memory comprising:

a regular array of storage elements;

a regular array of write multiplexers, each write multiplexer to select from among a plurality of bit lines an active bit line to write write data to a selected storage element within said regular array of storage elements.

Viewed from another aspect the present disclosure provides a memory comprising:

a regular array of storage element means for storing data bits;

a regular array of write multiplexer means for switching, each write multiplexer means for selecting from among a plurality of bit lines an active bit line to write write data to a selected storage element means within said regular array of storage element means.

Viewed from further aspect the present disclosure provides a method of forming data representing a design of a memory comprising the steps of:

selecting an array of storage elements to form part of said memory;

selecting from among a plurality of arrays of write multiplexers providing differing numbers of write ports a selected array of write multiplexers with a given number of write ports to form part of said memory; and disposing said selected array of write multiplexers within said design, each write multiplexer to select from among a plurality of bit lines an active bit line to write write data to a selected storage element within said array of storage elements.

The above, and other objects, features and advantages of this disclosure will be apparent from the following detailed description of illustrative embodiments which is to be read in connection with the accompanying drawings.

DRAWINGS

Figure 2:
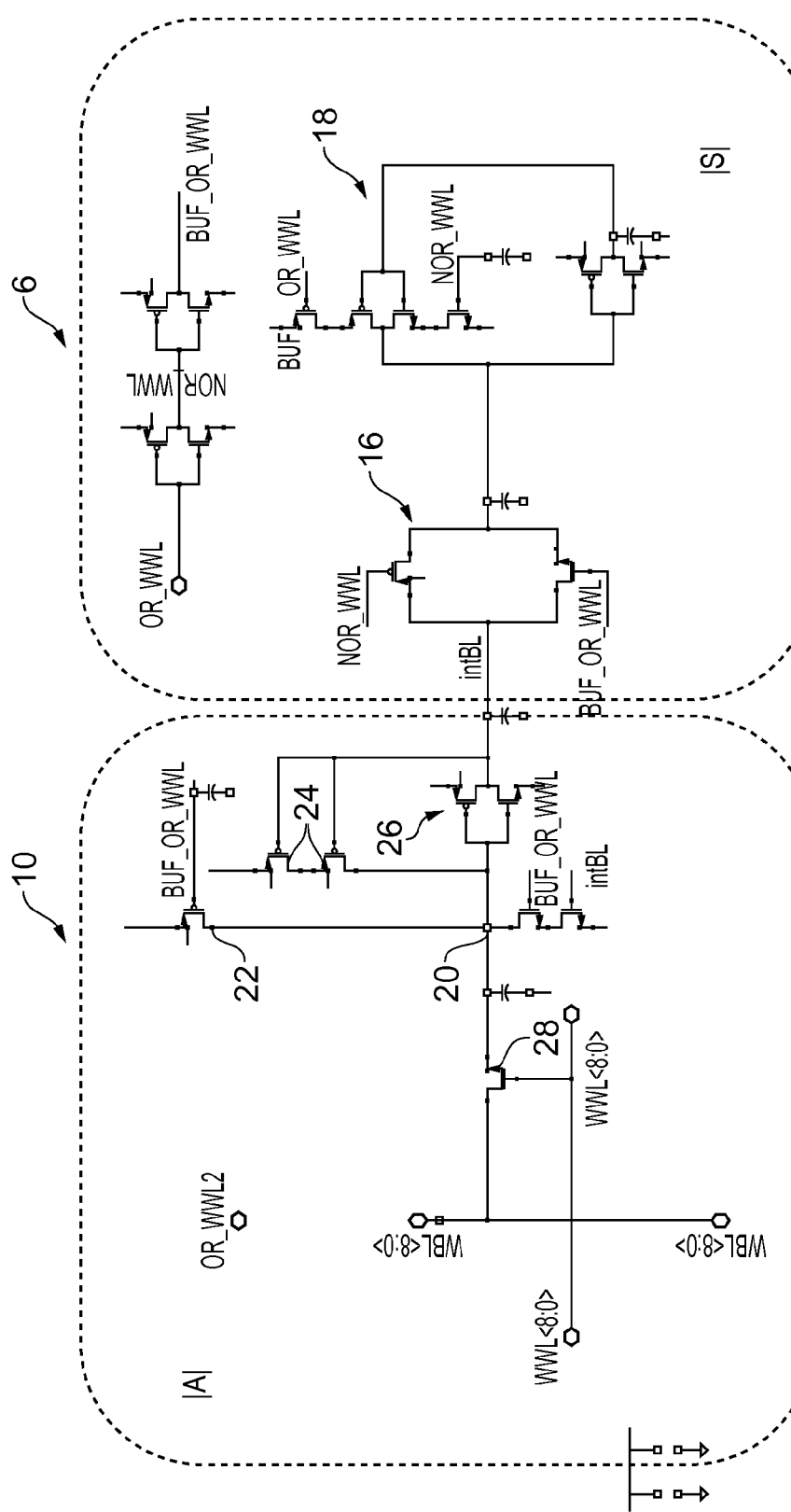
Figure 3:
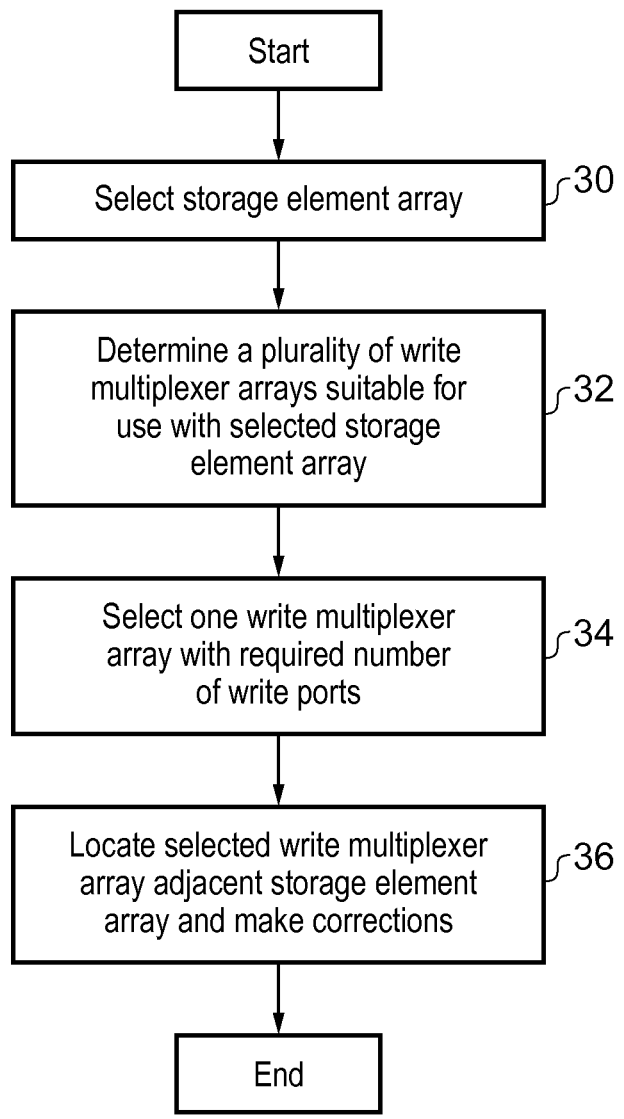

FIG. 1 schematically illustrates a memory including multiple write ports and multiple read ports;

FIG. 2 schematically illustrates a storage element S and a domino multiplexer A; and FIG. 3 is a flow diagram schematically illustrating write port configuration in generating a memory design.

EMBODIMENTS

This memory has the combination of features that both the array of storage elements and the array of write multiplexers are regular arrays (e.g. with a periodic repeating structure). This arrangement facilitates the reuse of the regular array of storage elements with multiple different forms of the regular array of write multiplexers which can provide different numbers of write ports as required by a particular use. Furthermore, in some example embodiments, arranging a regular array of write multiplexers outside of the regular array of storage elements enables some of the operational difficulties associated with, for example, a large fan in from the multiplexers to the storage elements to be addressed.

In some embodiments of the present disclosure the selected storage element may be controlled by a common word line signal that switches the storage element to a write state to store write data when any of a plurality of write bit lines is selected as an active bit line. The common word line signal can be an OR of word line signals associated with the individual write bit lines. The use of a common word line signal to control the storage elements helps address issues associated with fan in to the storage elements.

While it will be appreciated that the write multiplexer can take a number of different forms, one form which operates well in this context is a domino logic write multiplexer serving to connect the active bit line to a precharged node and to selectively discharge the precharged node in dependence upon the value of the write data on the active bit line.

The change in charge on the precharged node may then be connected via an inverter to the selected storage element.

The ready reuse of the regular array of storage elements with the different regular arrays of write multiplexers having different numbers of write ports may be facilitated when the storage element pitch matches the write multiplexer pitch as significant alterations in the connection routing can be avoided.

The memory may additionally be provided with a regular array of read multiplexers disposed outside the regular array of storage elements with each read multiplexer serving to select from among a plurality of bit lines an active bit line to read read data from a selective storage element within the regular array of storage elements. Such an arrangement facilitates the reuse of the regular array of storage elements with different regular arrays of read multiplexers containing different numbers of read ports.

While the memory of the present disclosure can be used in a variety of different situations, one particular application of such an array is to serve as a register file to which multiple write port access is desired.

When designing a memory in accordance with the present disclosure, an array of storage elements with a given storage capacity may be selected for use. Such an array will typically have a predetermined aspect ratio and a predetermined pitch of the storage elements. A library of designs for arrays of write multiplexers providing different numbers of write ports can then be used to select an array of write multiplexers to use having a desired number of write ports for the application concerned. The separation of the array of storage elements from the array of write multiplexers facilitates the quasi independent selection of the form of the array of storage elements and the form of the array of write multiplexers. The array of write multiplexers is then disposed within the design outside of the array of storage elements with each write multiplexer serving to select from among a plurality of bit lines an active bit line to write data to a selected storage element within the array of storage elements.

The same freedom to select the number of write ports for use with a given array of storage elements may also be applied to selection of the array of read multiplexers providing a desired number of read ports to access that same array of storage elements.

FIG. 1 schematically illustrates a memory 2 including an array of storage elements 4 comprising individual storage elements 6. The array of storage elements 4 is a regular array having a repeating periodic structure. Such regular arrays are conducive to high density, high efficiency memory implementations.

Disposed outside the array of storage elements 4 is a regular array of write multiplexers 8 comprising individual write multiplexers 10. Each of the write multiplexers 10 serves to select for connection to a bit line 12 the write data supplied to one of a plurality of bit lines 14 which are inputs corresponding to multiple write ports. The selected one of the bit lines 14 is the active bit line for a given write.

The bit line 12 from a given write multiplexer 10 is dedicated to an individual storage element 6 within the regular array of storage elements 4. Thus, as illustrated, for each column of storage elements, there are provided a stack of write multiplexers with one write multiplexer 10 dedicated to each storage element within the column. The array of write multiplexers 8 accordingly performs both row multiplexing to select the row within the regular array of storage elements 4 as well as the write port selection. In the example illustrated in FIG. 1, the column of storage elements comprising storage elements $SE_{00}$, $SE_{01}$, . . . will have eight bit lines 12 emerging at the base of the column with these individual bit lines 12 being dedicated to corresponding individual storage elements 6.

As is illustrated in FIG. 1, the pitch of the write multiplexers 10 matches the column pitch of the storage elements 6. Different versions of the regular array of write multiplexers 8 may be provided to support different numbers of write ports and these may have a common interface with the regular array of storage elements 4 provided through the individual bit lines 12. Thus, if each column of storage elements has eight bit lines 12 emerging from it, then the different versions of the regular arrays of write multiplexers 8 can be provided to accept and drive these same eight individual bit lines 12 for each column of storage element 6. The support of different numbers of write ports is accommodated by variations within the write multiplexers 10 themselves which are located outside of the regular array of storage element 6.

As will be seen in FIG. 1, the memory 2 can be provided with a regular array of read multiplexers 12 comprising individual read multiplexers 14 which serve to select from a plurality of output bit lines an active bit line to read data from a selected storage element 6 within the regular array of storage elements 4.

FIG. 2 schematically illustrates one example form of a storage element 6 and a write multiplexer 10. The storage element 6 comprises a transmission gate 16 controlled by an inverted version of a common word line signal (OR_WWL). This common word line signal OR_WWL may be generated by a logical OR of all the individual write word line signals WWL<8:0> associated with the individual write ports. The storage element 6 also includes a latch 18 employing feedback interrupted by the common word line signal (an inverted form thereof) to store a data value within the storage element 6. When it is desired to write to the storage element 6, the transmission gate 16 is opened (rendered transmissive) and the feedback within the latch 18 disabled so that the signal value carried by the internal bit line intBL from the write multiplexer 10 passes through the transmission gate 16 into the latch 18. When the common word line signal changes state after the write operation, the transmission gate 16 is closed and feedback within the latch 18 is restored such that the captured write data value is held within the latch 18.

The write multiplexer 10 has the form of a domino logic multiplexer. A node 20 is precharged through a precharge transistor 22. An arrangement of weak keeper transistors 24 serves to maintain the value to which the node 20 is driven. The node 20 is coupled by an inverter 26 (which acts as a shield to noise from the bit line 12) to the bit line 12 (intBL) which passes into the regular array of storage elements 4 and is able to write a write data value to the latch 18 as discussed above.

Connected to the node 20 are a plurality of discharge transistors 28. One discharge transistor 28 is provided for each write port. In the example illustrated there are nine write ports. If the write word line WWL<x> is asserted for a given write port x, then the discharge transistor 28 for that write port will open so that if the write data value on the corresponding write bit line WBL<x> is low, then the node 20 will be discharged through the discharge transistor 28. If the write data value is high, then the node 20 will remain charged. Accordingly, in dependence upon which of the write word lines WWL<8:0> is asserted, a corresponding discharge transistor 28 will open and a corresponding bit line value WBL<8:0> will be applied to the node 20, from where it is written into the latch 18. Only one write word line WWL<8:0> is asserted at any given time.

FIG. 3 schematically illustrates a method for forming data representing a design of a memory. This representation could be at one or more of a plurality of different levels (views) such as a layout view, a timing view, an power view, etc. At step 30, a storage element array 4 is selected with a given capacity, aspect ratio and storage element pitch. Step 32 then determines a set comprising a plurality of write multiplexer arrays which are suitable for use with the selected storage element array from step 30. These different write multiplexer arrays can support different numbers of write ports. Step 34 then selects one of the write multiplexer arrays for use. The user may specify, for example, the number of write ports they wish to provide and this may be used to drive the selection of which write multiplexer array should be used for the design. Step 36 then serves to select and locate the write multiplexer array adjacent to and outside the storage element array and to make the electrical connections between the bit lines which pass through the storage element array and the bit lines output from the write multiplexer array.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:
1. A memory comprising:
a regular array of storage elements; and
a regular array of write multiplexers, each write multiplexer to select from among a plurality of bit lines an active bit line to write write data to a selected storage element within said regular array of storage elements, wherein said write multiplexer connects said active bit line to a precharged node via a discharge transistor and, in dependence upon an asserted write word line coupled to a gate of the discharge transistor, said write multiplexer applies a corresponding bit line value to the precharged node, wherein said write multiplexer has an inverter and at least one keeper transistor connected between said precharged node and said selected storage element, such that said precharged node is coupled to said selected storage element via said inverter, wherein an output of said inverter is connected to a gate of said at least one keeper transistor, and an output of said at least one keeper transistor is connected to an input of said inverter at said precharged node, and wherein said at least one keeper transistor is activated based on the output of said inverter so as to maintain the corresponding bit line value to which said discharge node is driven.

2. A memory as claimed in claim 1, wherein said regular array of write multiplexers is disposed outside said regular array of storage elements.

3. A memory as claimed in claim 1, wherein said selected storage element is controlled by a common word line signal that switches said selected storage element to a write state to store said write data when any of said plurality of write bit lines is selected as an active bit line.

4. A memory as claimed in claim 3, wherein said write multiplexer receives a plurality of individual word line signals, each individual word line signal indicating whether a corresponding one of said plurality of write bit lines should be selected by said write multiplexer as said active write bit line.

5. A memory as claimed in claim 4, comprising an OR circuit to generate said common word line signal as a logical OR of said plurality of individual word line signals.

6. A memory as claimed in claim 3, wherein said selected storage element comprises transmission gate switched by said common word line signal and a latch with feedback interrupted by said common word line signal.

7. A memory as claimed in claim 1, wherein said write multiplexer comprises a domino logic write multiplexer to connect said active bit line to the precharged node and to selectively discharge said precharged node in dependence upon a value of said write data.

8. A memory as claimed in claim 1, wherein said inverter is formed to shield noise arising in said plurality of bit lines reaching said precharged node.

9. A memory as claimed in claim 1, wherein a storage element pitch of said regular array of storage elements matches a write multiplexer pitch of said regular array of write multiplexers.

10. A memory as claimed in claim 1, comprising a regular array of read multiplexers disposed outside said regular array of storage elements, each read multiplexer to select from among a plurality of bit lines an active bit line to read read data from a selected storage element within said regular array of storage elements.

11. A memory as claimed in claim 1, wherein said regular array of storage elements serves as a register file.

12. A memory as claimed in claim 1, wherein said corresponding bit line value is written into a latch from the precharged node.

13. A memory comprising:
a regular array of storage element means for storing data bits; and
a regular array of write multiplexer means for switching, each write multiplexer means for selecting from among a plurality of bit lines an active bit line to write write data to a selected storage element means within said regular array of storage element means, wherein said write multiplexer means connects said active bit line to a precharged node via a discharge transistor and, in dependence upon an asserted write word line coupled to a gate of the discharge transistor, said write multiplexer means applies a corresponding bit line value to the precharged node, wherein said write multiplexer has an inverter and at least one keeper transistor connected between said precharged node and said selected storage element, such that said precharged node is coupled to said selected storage element via said inverter, wherein an output of said inverter is connected to a gate of said at least one keeper transistor, and an output of said at least one keeper transistor is connected to an input of said inverter at said precharged node, and wherein said at least one keeper transistor is activated based on the output of said inverter so as to maintain the corresponding bit line value to which said discharge node is driven.

14. A method of forming data representing a design of a memory comprising:
selecting an array of storage elements to form part of said memory;
selecting from among a plurality of arrays of write multiplexers providing differing numbers of write ports a selected array of write multiplexers with a given number of write ports to form part of said memory; and
disposing said selected array of write multiplexers within said design, each write multiplexer to select from among a plurality of bit lines an active bit line to write write data to a selected storage element within said array of storage elements, wherein said write multiplexer connects said active bit line to a precharged node via a discharge transistor and, in dependence upon an asserted write word line coupled to a gate of the discharge transistor, said write multiplexer applies a corresponding bit line value to the precharged node, wherein said write multiplexer has an inverter and at least one keeper transistor connected between said precharged node and said selected storage element, such that said precharged node is coupled to said selected storage element via said inverter, wherein an output of said inverter is connected to a gate of said at least one keeper transistor, and an output of said at least one keeper transistor is connected to an input of said inverter at said precharged node, and wherein said at least one keeper transistor is activated based on the output of said inverter so as to maintain the corresponding bit line value to which said discharge node is driven.

15. A method as claimed in claim 14, wherein said array of storage elements is a regular array of storage elements.

16. A method as claimed in claim 15, wherein said array of write multiplexers is a regular array of storage write multiplexers.

17. A method as claimed in claim 16, wherein a storage element pitch of said regular array of storage elements matches a write multiplexer pitch of said regular array of write multiplexers.

18. A method as claimed in claim 14, comprising selecting from among a plurality of arrays of read multiplexers providing differing numbers of read ports a selected array of read multiplexers with a given number of read ports; and disposing said selected array of read multiplexers within said memory outside said array of storage elements, each read multiplexer to select from among a plurality of bit lines an active bit line to read read data from a selected storage element within said array of storage elements.

19. A method as claimed in claim 14, wherein said array of storage elements serves as a register file.

* * * * *